United States Patent
Subrahmanyam et al.

(10) Patent No.: US 12,213,288 B2
(45) Date of Patent: Jan. 28, 2025

(54) SELF COOLING ADAPTIVE FLOW BRANCHING HEAT EXCHANGER SYSTEM FOR COOLING OF ONE OR MORE SEMICONDUCTOR CHIPS

(71) Applicant: Intel Corporation, Santa Clara, CA (US)

(72) Inventors: Prabhakar Subrahmanyam, San Jose, CA (US); Arun Krishnamoorthy, Portland, OR (US); Victor Polyanko, Kent, WA (US); Ying-Feng Pang, San Jose, CA (US); Yi Xia, Campbell, CA (US); Pooya Tadayon, Portland, OR (US); Muhammad Ahmad, Fremont, CA (US); Rahima K. Mohammed, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 884 days.

(21) Appl. No.: 17/134,368

(22) Filed: Dec. 26, 2020

(65) Prior Publication Data

US 2021/0120703 A1 Apr. 22, 2021

(51) Int. Cl.
H05K 7/20 (2006.01)

(52) U.S. Cl.
CPC ..... *H05K 7/20772* (2013.01); *H05K 7/20263* (2013.01); *H05K 7/20272* (2013.01); *H05K 7/20836* (2013.01)

(58) Field of Classification Search
CPC ........... H05K 7/20772; H05K 7/20263; H05K 7/20272; H05K 7/20836
See application file for complete search history.

(56) References Cited

U.S. PATENT DOCUMENTS

| | | | |
|---|---|---|---|
| 2013/0081799 A1* | 4/2013 | Loblich | F24H 15/443 165/200 |
| 2013/0340994 A1* | 12/2013 | David | H05K 7/20836 165/287 |

(Continued)

*Primary Examiner* — Kenneth M Lo
*Assistant Examiner* — Mohammed Shafayet
(74) *Attorney, Agent, or Firm* — Hanley, Flight & Zimmerman, LLC

(57) ABSTRACT

An apparatus is described. The apparatus includes a liquid cooling system having multiple heat-exchangers and multiple valves. The multiple valves are to enable/disable participation of individual ones of the heat-exchangers within the liquid cooling system. The apparatus includes an information keeping device to store information that correlates a number of the multiple heat exchangers to be enabled to realize one or more semiconductor chips' target temperature for a power consumption of the one or more semiconductor chips for a plurality of combinations of target temperature and power consumption. The controller is coupled to the liquid cooling system and the information keeping device to dynamically determine during runtime of a system having the one or more semiconductor chips an appropriate number of the multiple heat exchangers to enable to realize a particular target temperature for the one or more semiconductor chips for a particular power consumption of the one or more semiconductor chips, and, update the information in the information keeping device with a new correlation that correlates the appropriate number with the particular target temperature and particular power consumption.

21 Claims, 17 Drawing Sheets

(56) References Cited

U.S. PATENT DOCUMENTS

| | | | |
|---|---|---|---|
| 2015/0264838 A1* | 9/2015 | Chainer | G06F 1/3287 361/679.53 |
| 2020/0178422 A1* | 6/2020 | Campbell | G05D 23/1932 |

* cited by examiner

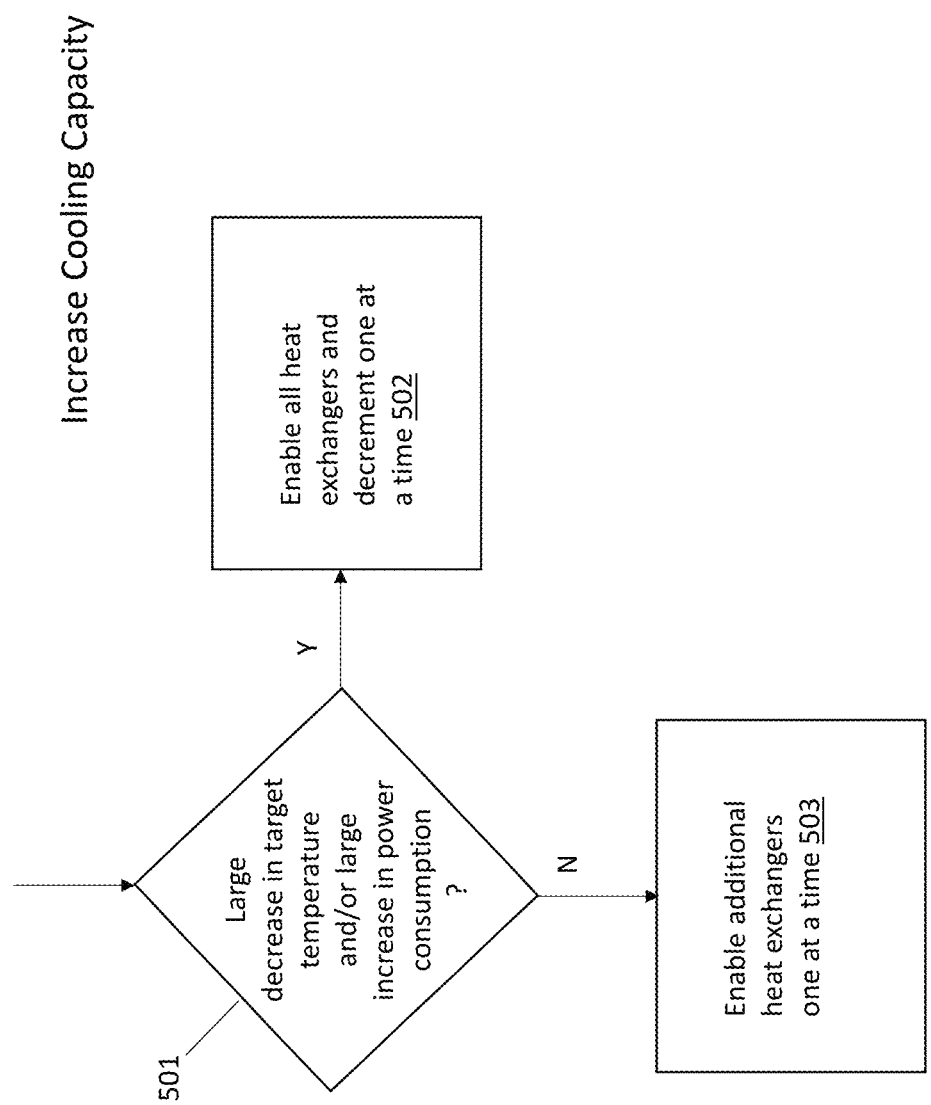

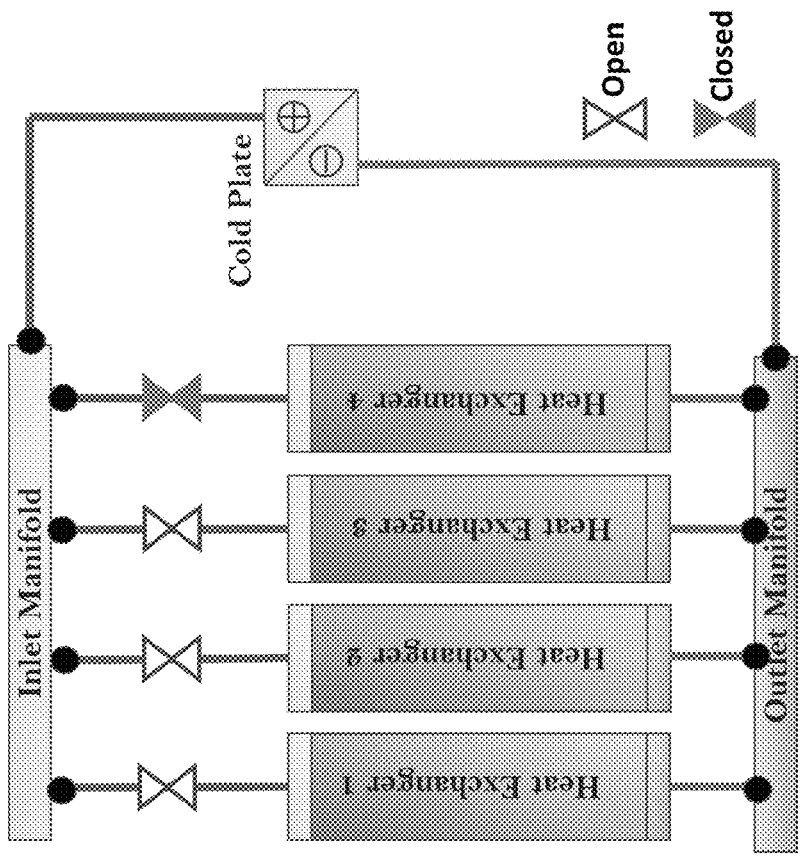
Fig. 8b Flow passing through Three radiators
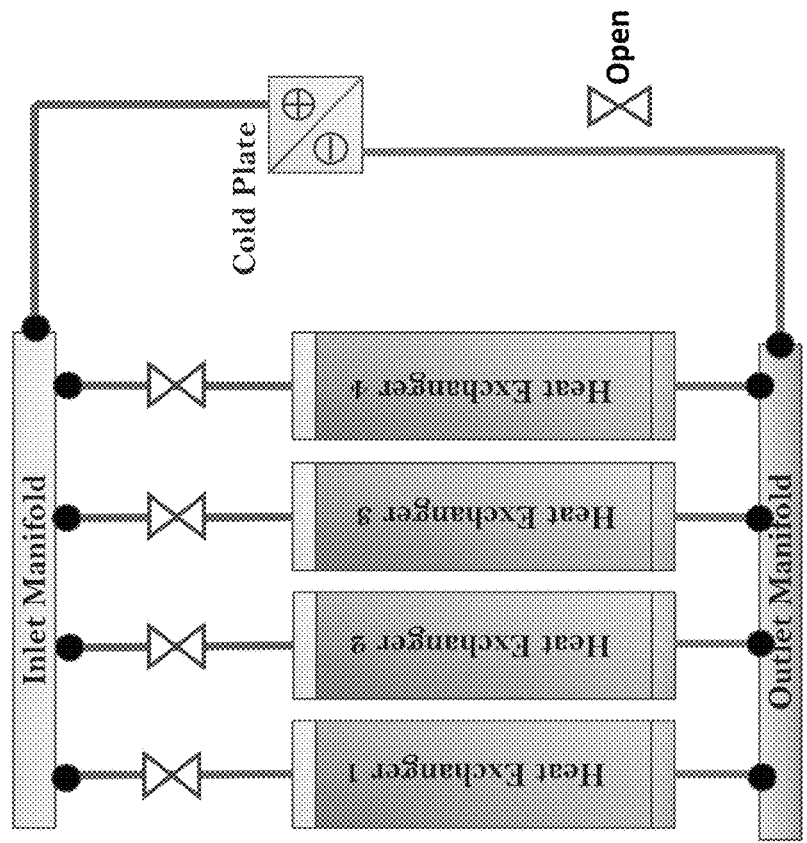
Fig. 8a Flow passing through four radiators

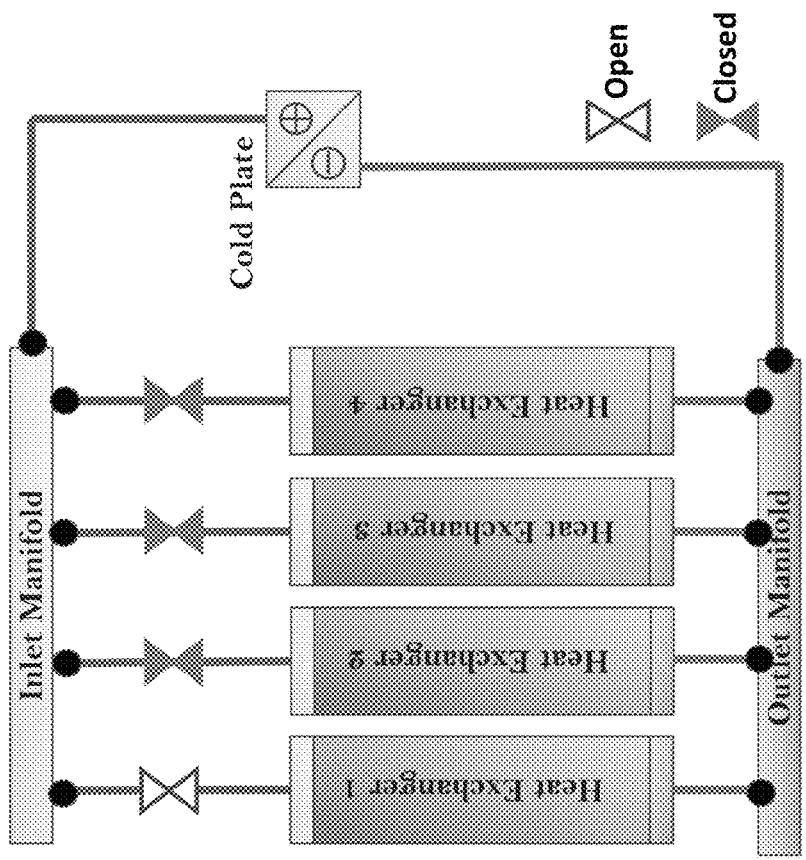
Fig. 8d — Flow passing through a single radiators
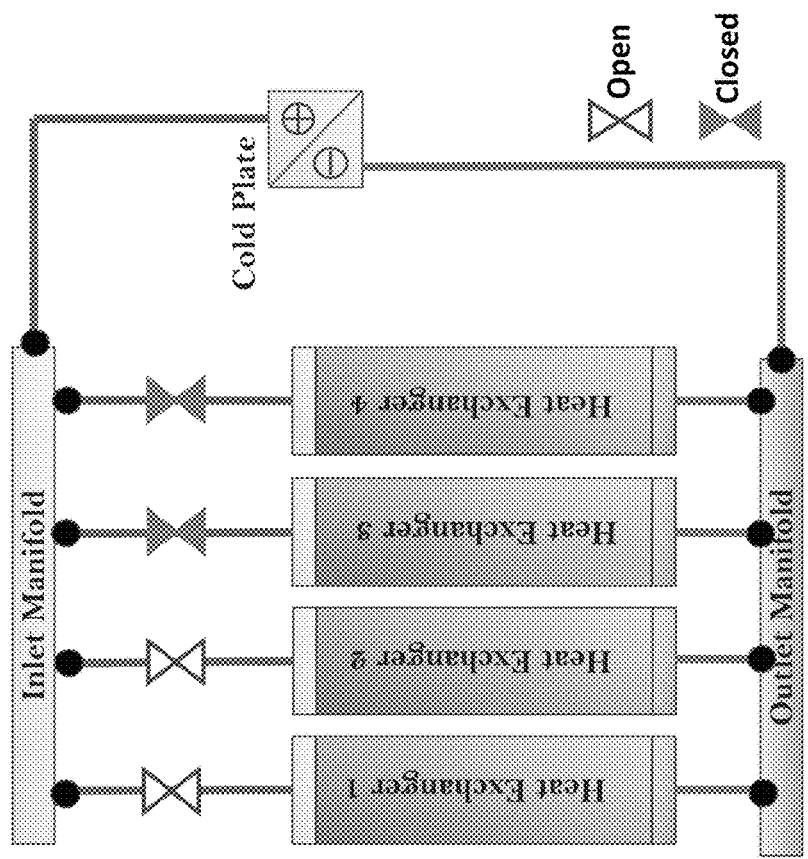
Fig. 8c — Flow passing through Two radiators

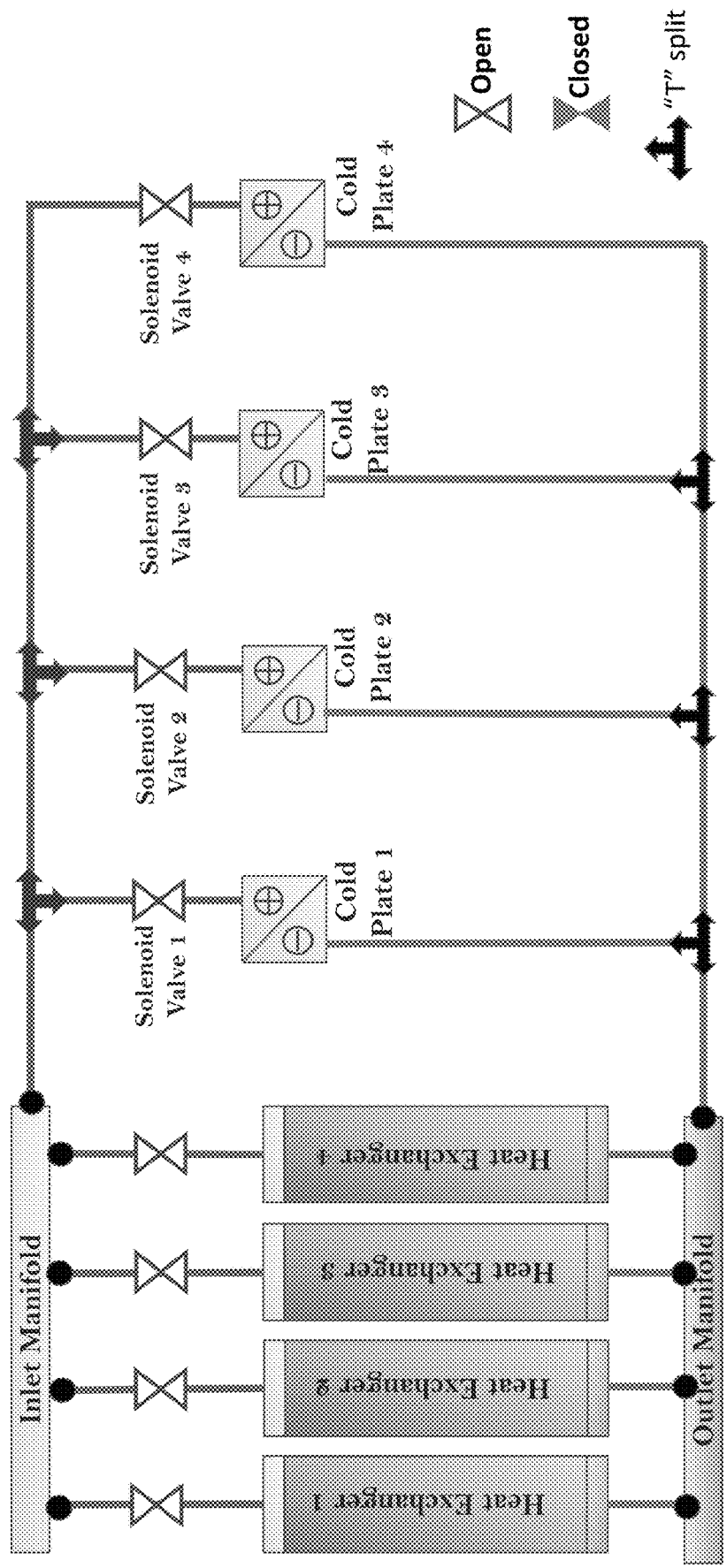

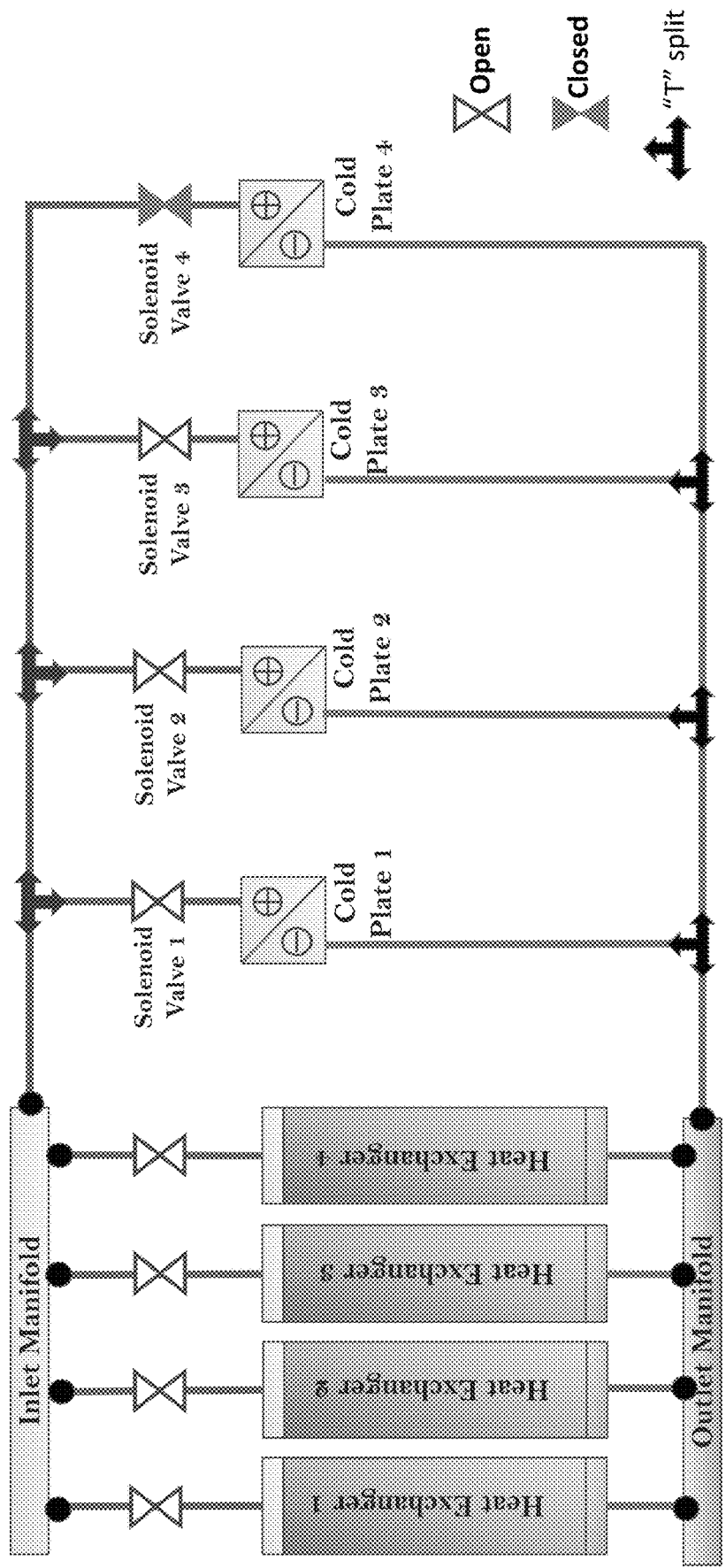

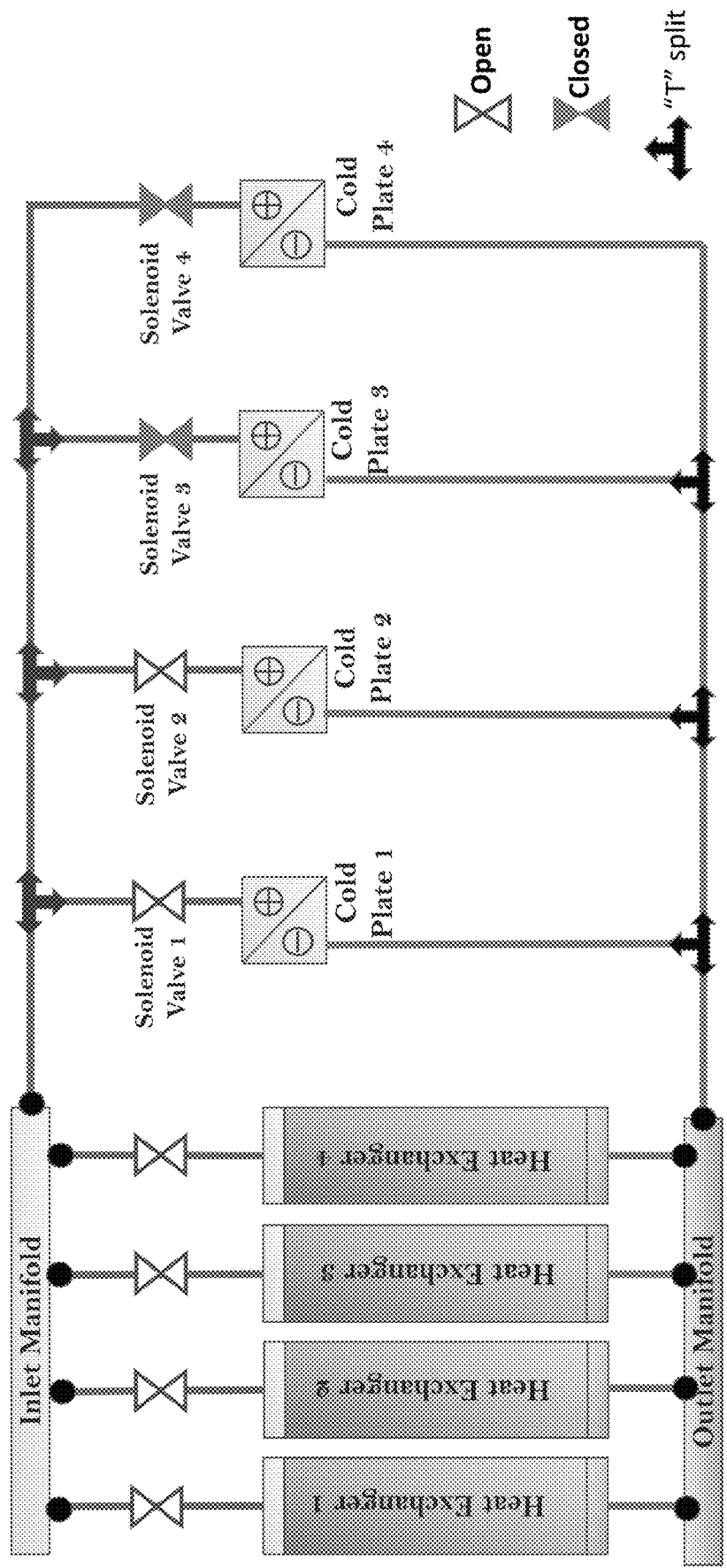

SELF COOLING ADAPTIVE FLOW BRANCHING HEAT EXCHANGER SYSTEM FOR COOLING OF ONE OR MORE SEMICONDUCTOR CHIPS

BACKGROUND

Figure 1:
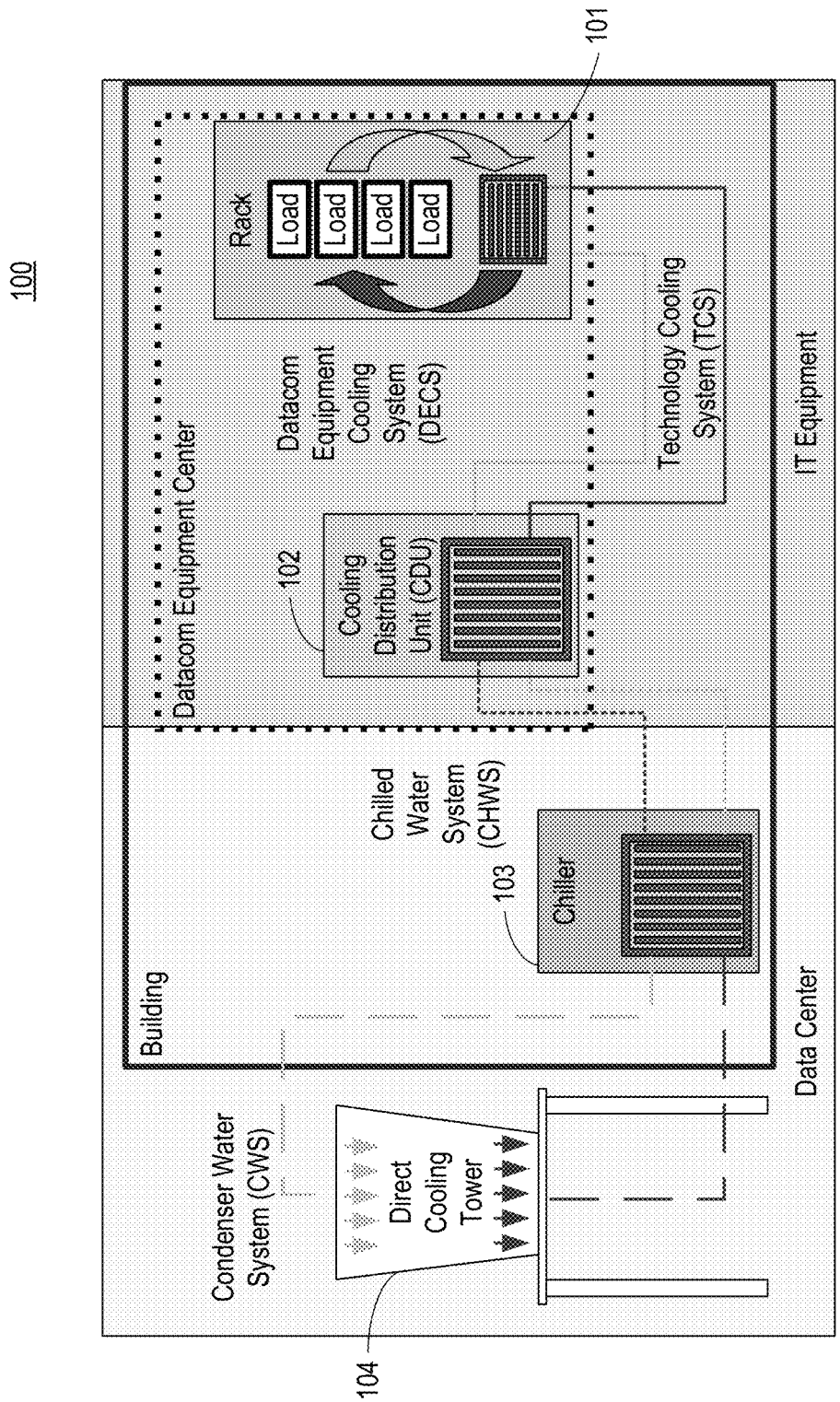

FIG. 1 shows a high level depiction of a high performance computing environment 100 such as a centralized data center or cloud service nerve center. As observed in FIG. 1, multiple racks 101 each containing shelves of computing equipment are located in a confined area. Generally, information systems (IS) managers desire to pack large amounts of computing performance into small areas. Likewise, semiconductor chip manufacturers and computing equipment manufacturers attempt to densely integrate high performance functionality into their respective products.

As the performance of semiconductor chips (and the computing/networking systems that the chips are integrated into) continues to increase, however, so does the associated power consumption. Unfortunately, the performance of many semiconductor chips and computing/networking system products has crossed a threshold at which traditional air-cooling is unable to keep the chips/equipment sufficiently cool.

As such, liquid cooling solutions are steadily being integrated into today's computing/networking systems. Here, the racks 101 within a high performance computing environment 100 not only include electrical interfaces and associated wiring to permit their various systems to communicate with other systems, but also, includes fluidic piping/channels to guide cooled/warmed fluids to/from these systems.

The warmed fluid emitted from the systems is drawn away from the racks and directed to a coolant distribution unit (CDU) 102. The CDU 102 acts as a first heat exchanger that receives cooled fluid from a chiller 103 and transfers heat from the fluid received by the racks 101 to the fluid received from the chiller 103. The removal of heat from the fluid received from the racks 101 cools the fluid which is then rerouted back to the racks 101 as cooled fluid. Likewise, the transfer of heat into the fluid received from the chiller 103 warms that fluid which is then routed back to the chiller 103.

The chiller 103 acts as a second heat exchanger that receives cooled fluid from a cooling tower 104. Heat is transferred from the warmed fluid received from the CDU 102 to the fluid received from the cooling tower 104. The removal of heat from the fluid received from the CDU 102 cools the fluid which is then routed back to the CDU 102 as cooled fluid. The transfer of heat warms the fluid received from the cooling tower 104 which is then routed back to the cooling tower 104 for cooling. The cooling tower 104 acts as a third heat exchanger that transfers heat from the fluid it receives to the ambient. This cools the fluid which is then routed back to the chiller 103.

Some CDUs 102 are designed to impart dynamic fluid control based on the usage of the systems within the racks 101. For example, during normal working hours, the systems that are plugged into the rack may be under high demand and therefore expend more energy. By contrast, during "off hours", these same systems may be under much less demand and therefore expend much less energy.

A cooling system's ability to remove heat from its constituent systems is proportional to the rate at which fluid flows through the systems, and/or, the amount of heat that the CDU can remove from the fluid per unit volume of fluid per unit of time. Some CDUs are therefore designed to modulate one or more of these parameters based upon observed overall usage and/or time of day. Specifically, during normal working hours the CDU is configured to remove more heat, whereas, during off hours the CDU is configured to remove less heat.

FIGURES

Figure 2:
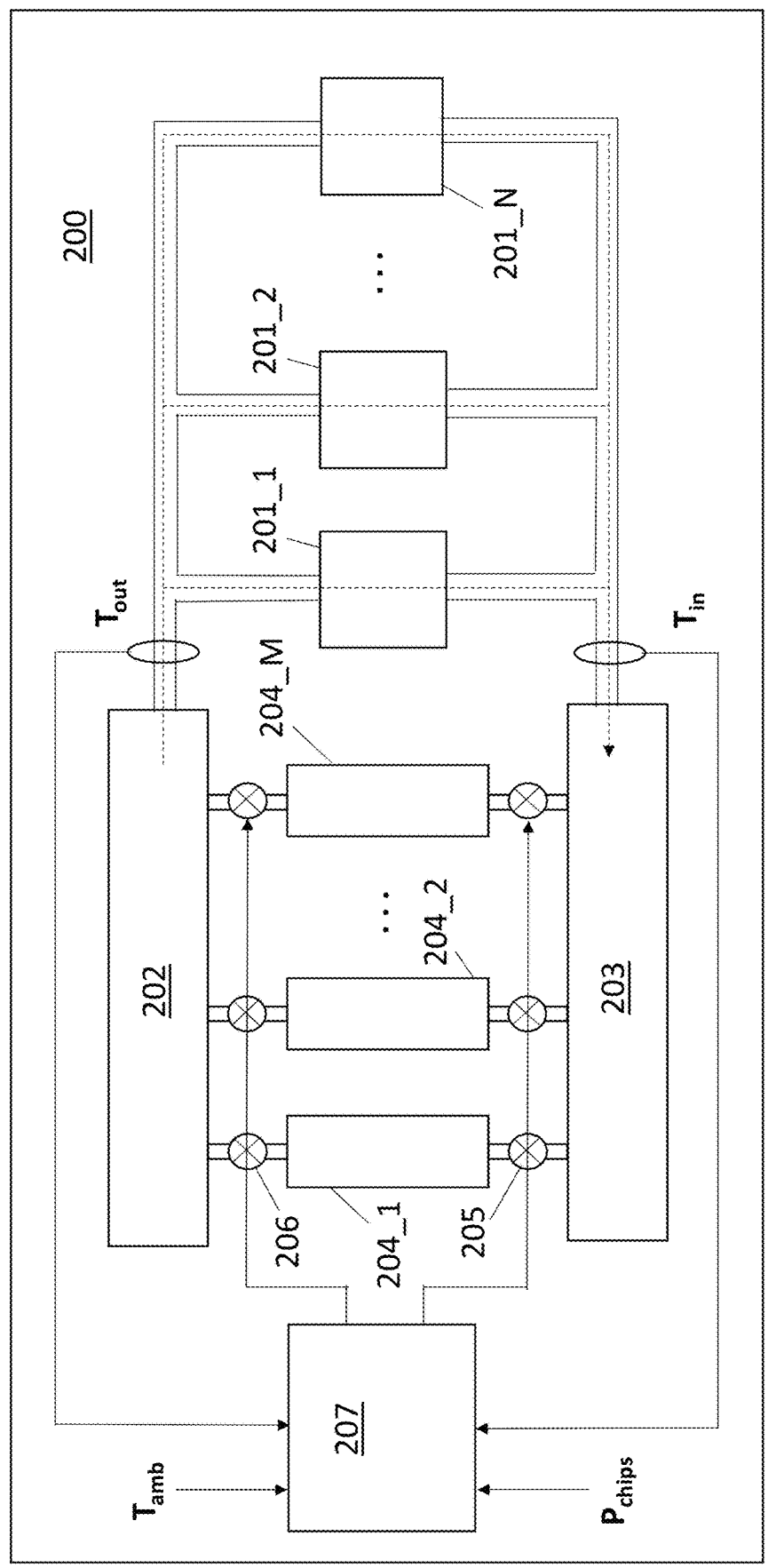
Figure 3:
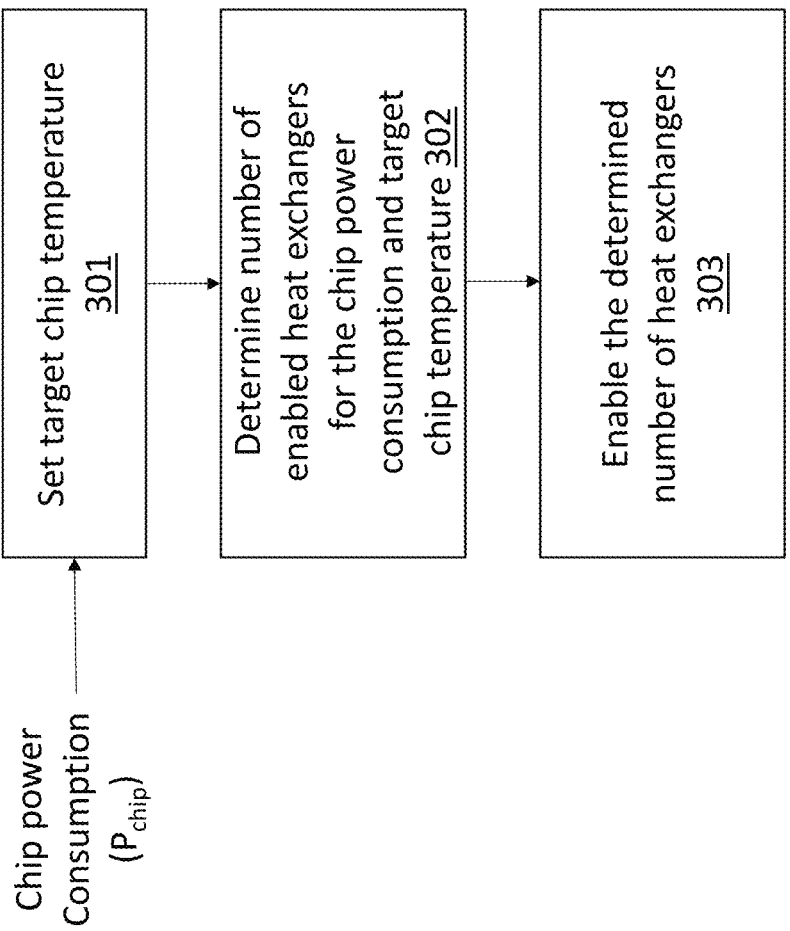
Figure 4:
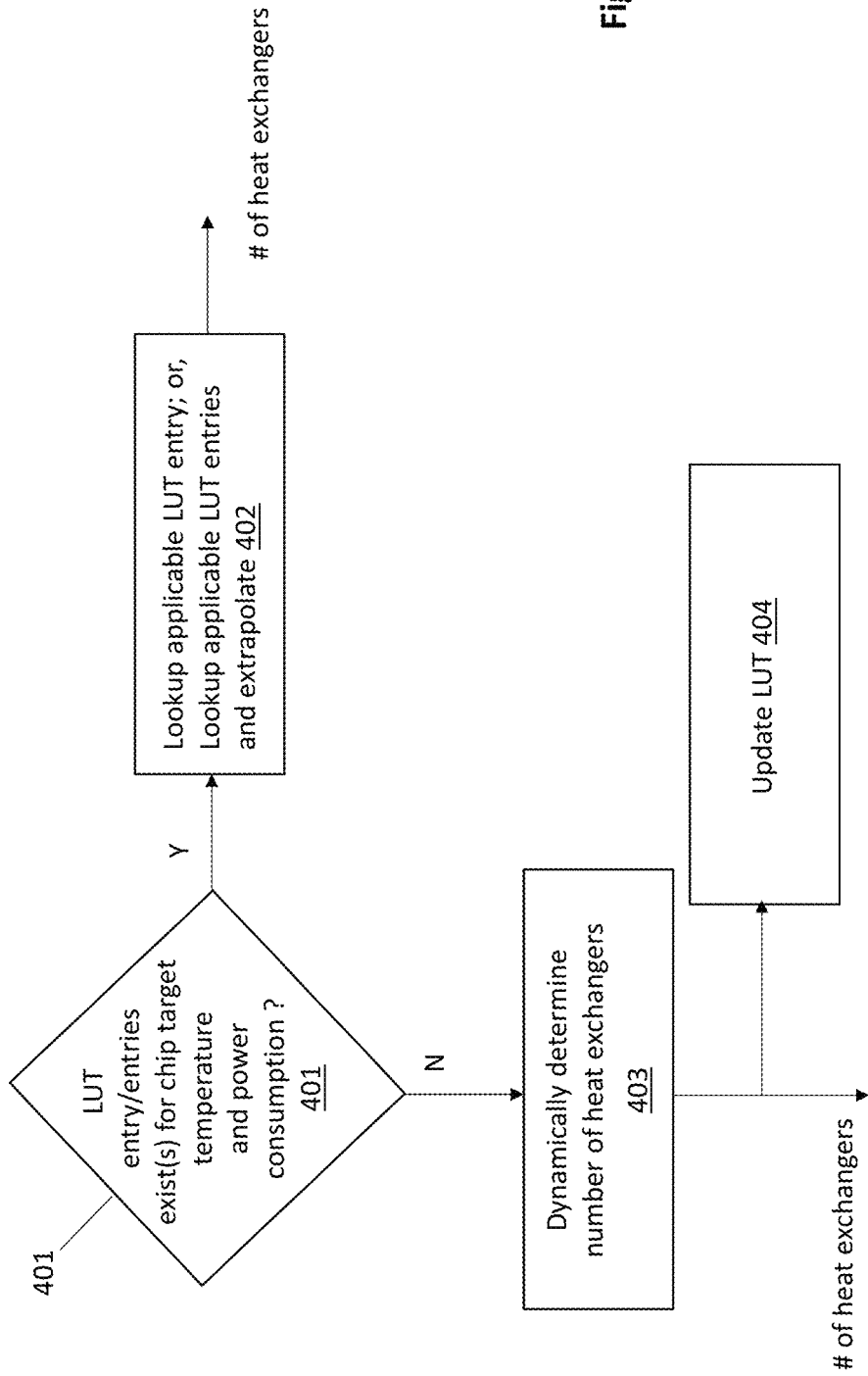
Figure 5B:
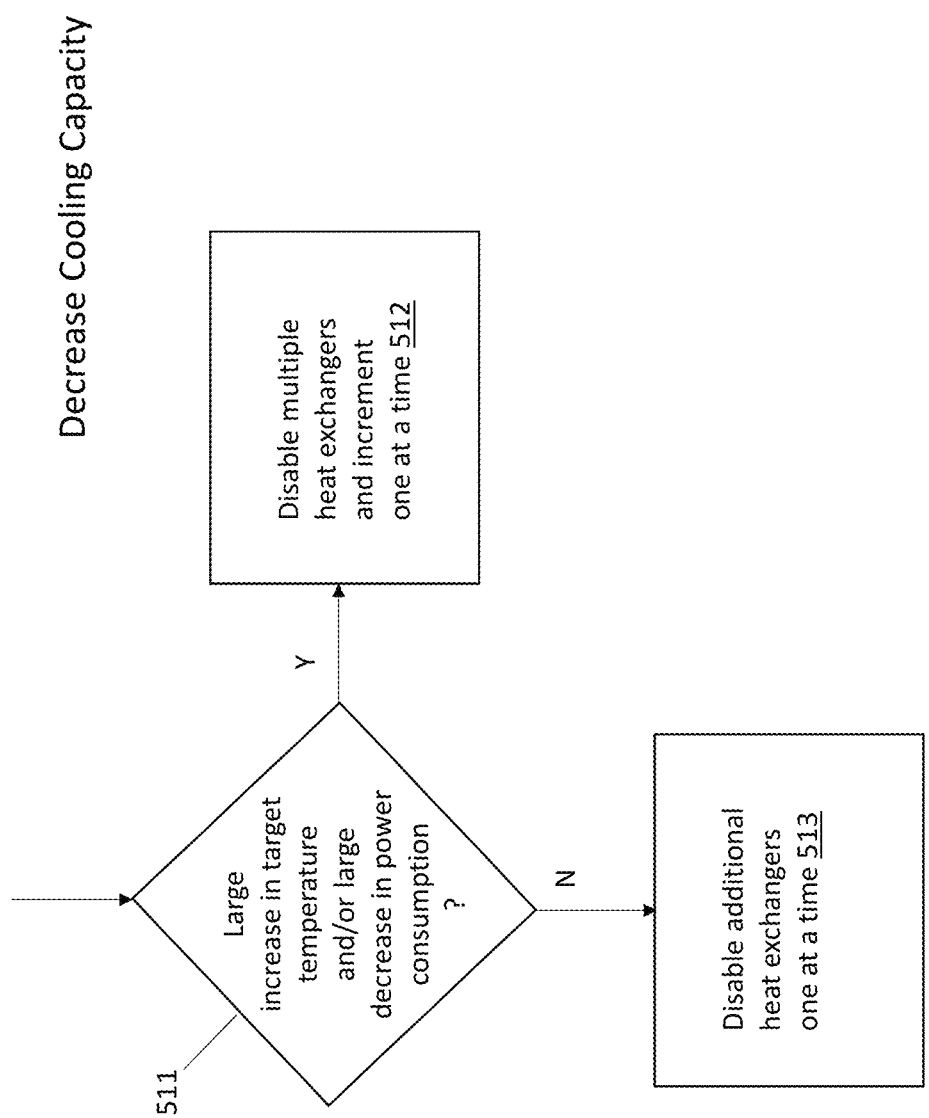
Figure 6:
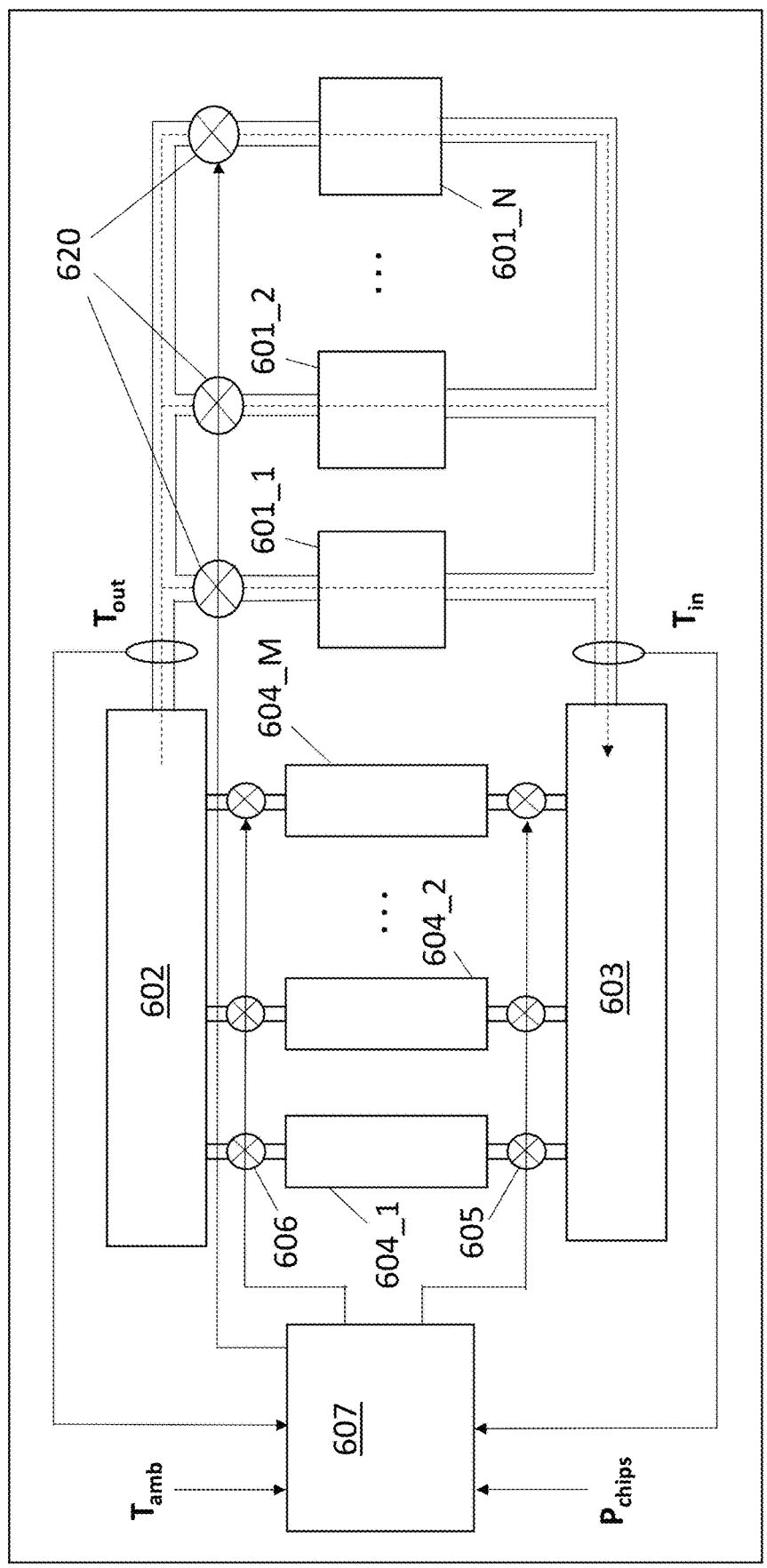
Figure 7:
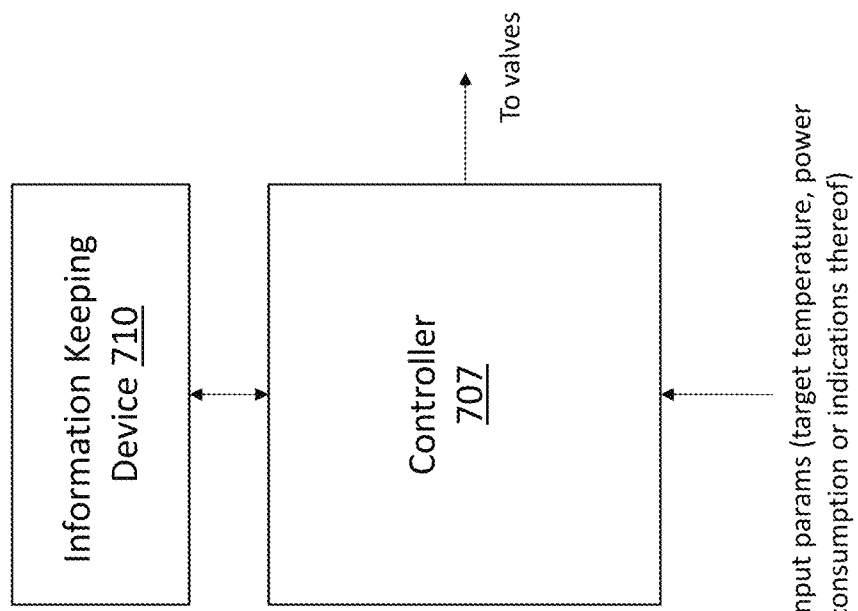
Figure 9D:
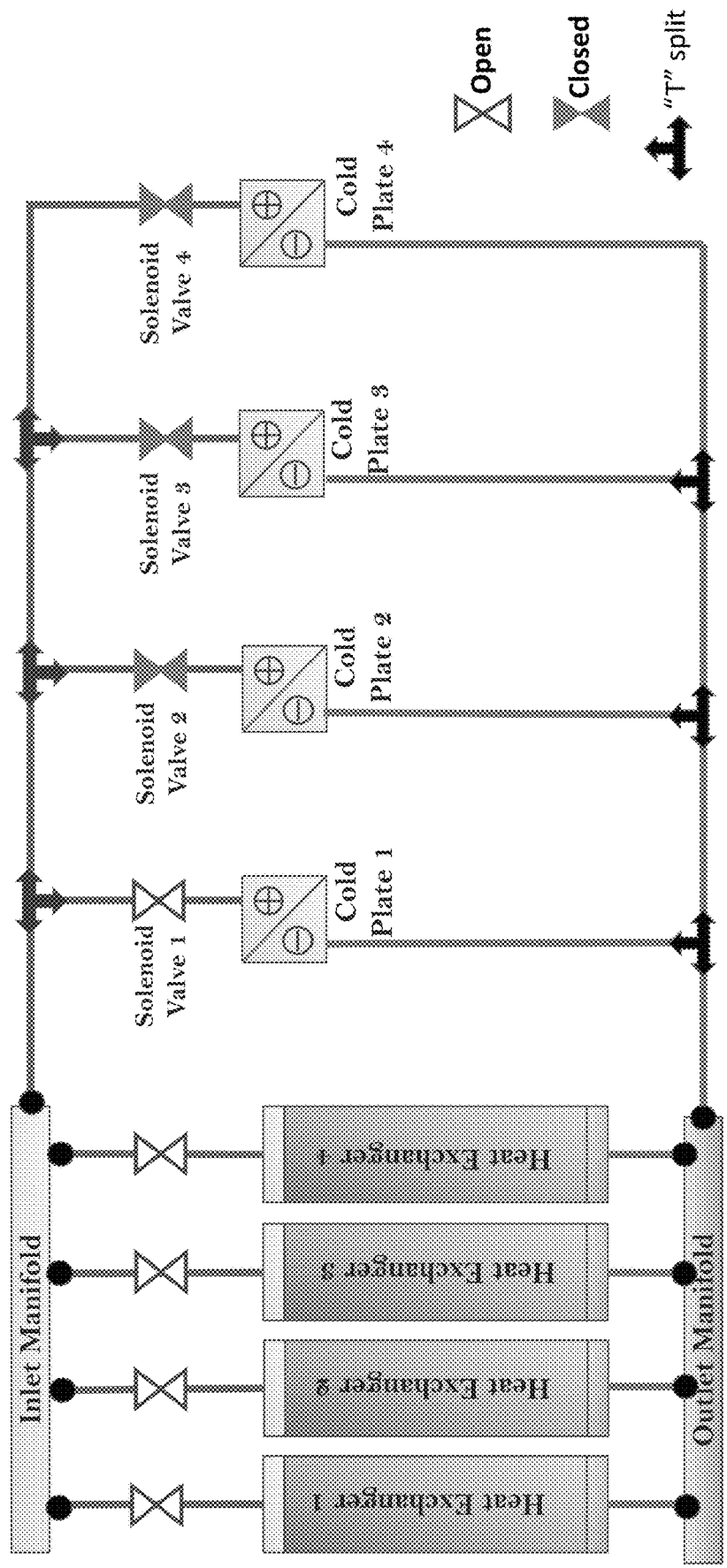
Figure 10:
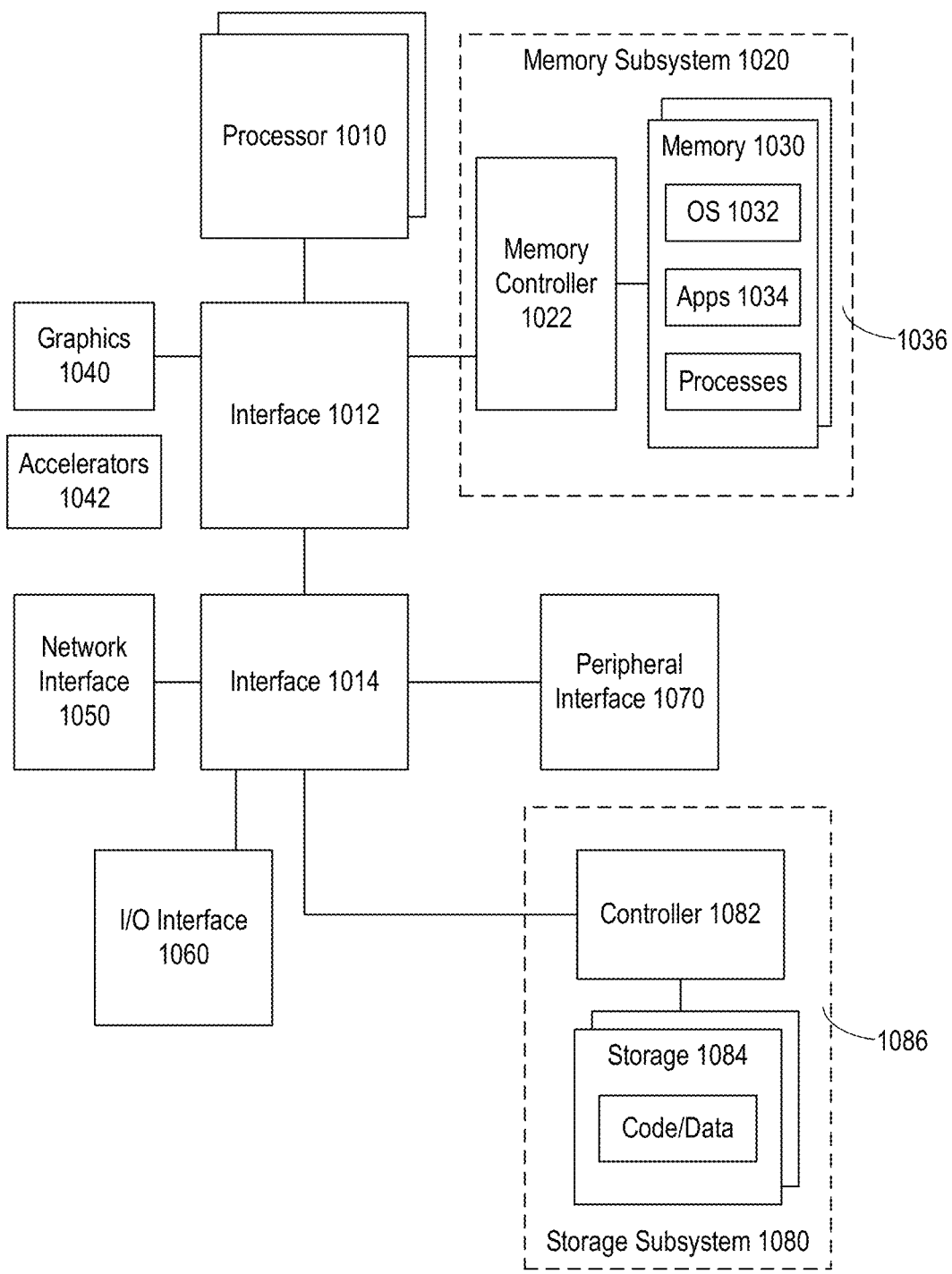
Figure 11:
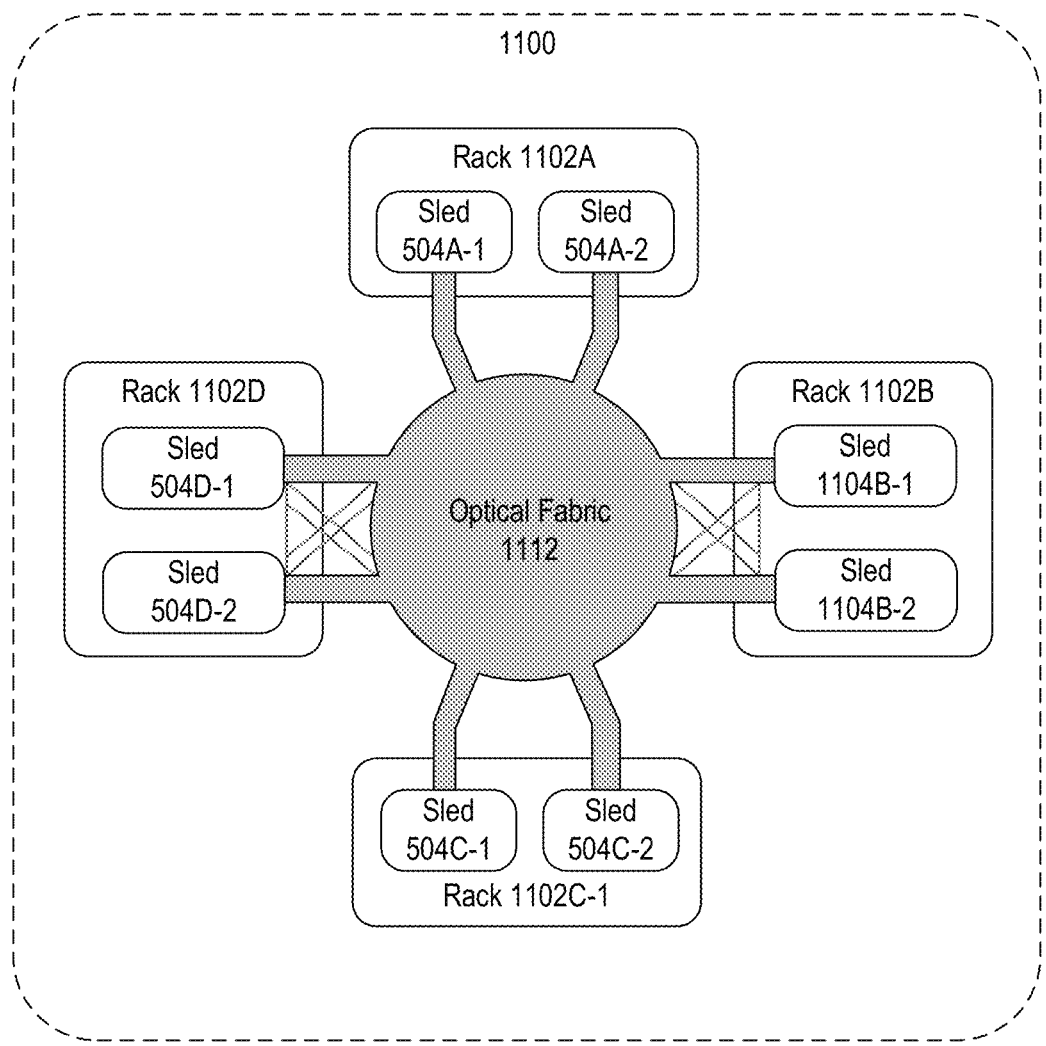
Figure 12:
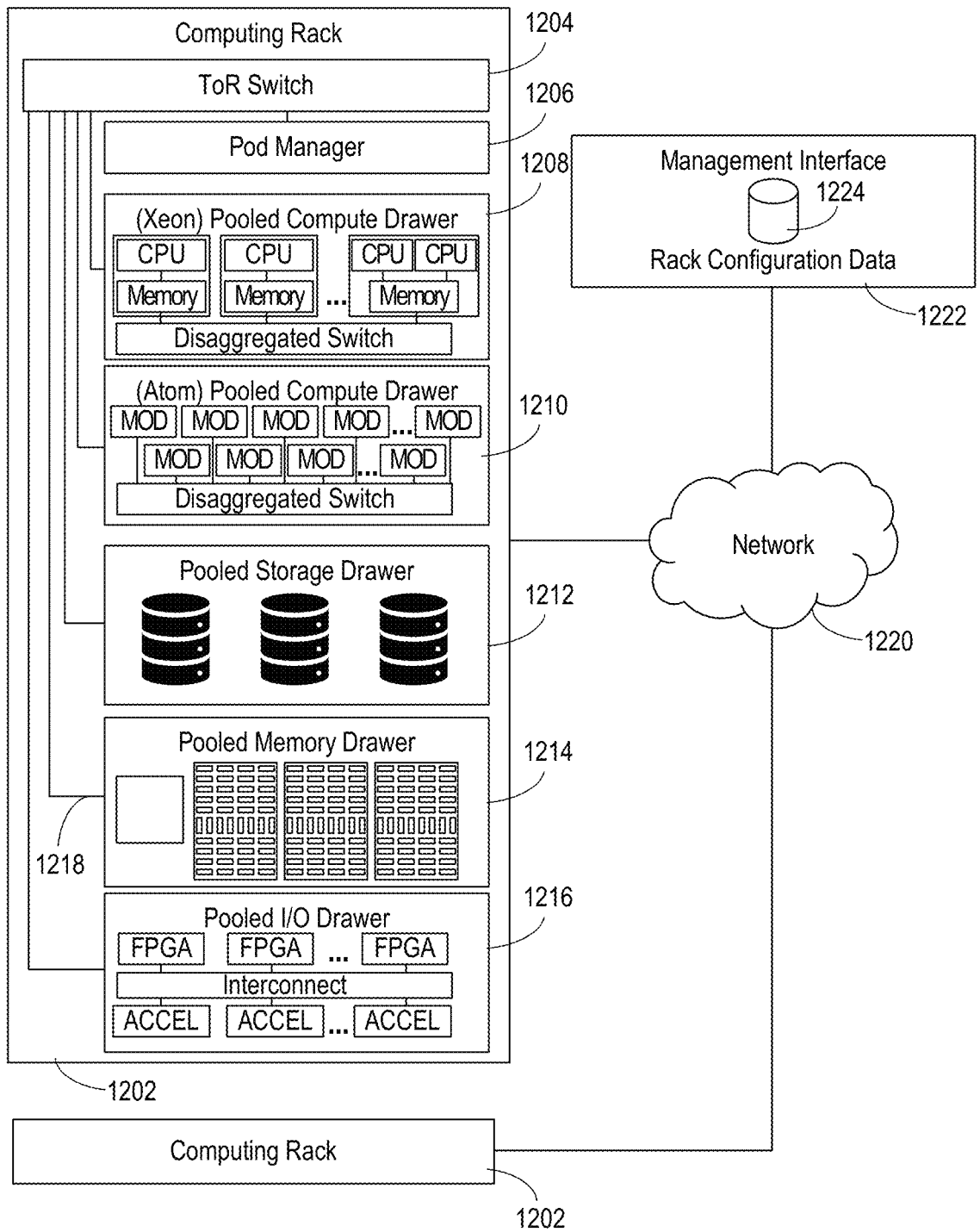

A better understanding of the present invention can be obtained from the following detailed description in conjunction with the following drawings, in which:

FIG. 1 shows a data center (prior art);
FIG. 2 shows an adaptive cooling system;
FIG. 3 shows a first method of the adaptive cooling system;
FIG. 4 shows a second method of the adaptive cooling system;
FIG. 5a shows a third method of the adaptive cooling system;
FIG. 5b shows a fourth method of the adaptive cooling system;
FIG. 6 shows another adaptive cooling system;
FIG. 7 shows a controller and an information keeping device;
FIGS. 8a, 8b, 8c and 8d depict a first set of scenarios for an adaptive cooling system;
FIGS. 9a, 9b, 9dc and 9d depict a second set of scenarios for an adaptive cooling system;
FIG. 10 shows a computing system;
FIG. 11 shows a data center;
FIG. 12 shows a rack.

DETAILED DESCRIPTION

A problem with the prior art approach is that the CDU regards each rack as a single unit, whereas, by contrast, each rack is composed of a number of constituent systems each having its own (potentially) unique heat removal needs. In many cases, there are at least some systems in a rack that do not need significant heat removal while other systems in the same rack require significant heat removal. Because the CDU is designed to treat a rack's cooling needs as a collective whole, the CDU is essentially configured to ensure that the highest heat dissipating system(s) in the rack are sufficiently cooled which, in turn, overcools the lesser heat dissipating system(s) in the same rack.

The overcooling of the lesser heat dissipating system(s) results in cost and/or performance inefficiency of the overall cooling system.

A solution is to provide finer grained adaptive cooling capability with the systems themselves. Here, if each system within a rack is able to adjust its own internal cooling flows and/or coolant temperatures adaptively to the actual heat removal needs of its own internal heat generating devices (e.g., high performance semiconductor chips, power converters, etc.) better overall cost and performance efficiency will be realized. In particular, if at any moment some systems within a rack are being heavily utilized such systems can apply more aggressive cooling to their internal devices, while, at the same time, other systems within the same rack are only being modestly used and can therefore apply less aggressive cooling to their internal devices. By so doing, e.g., over cooling of the modestly used systems is avoided.

FIG. 2 shows a system 200, such as a rack mountable server, or rack mountable disaggregated computing component (e.g., CPU unit, memory unit, mass storage unit) that includes N high performance semiconductor chips (e.g., CPU, GPU, accelerator, etc.) each with corresponding cold plate 201. In order to cool the high performance semiconductor chips, cooled fluid is emitted from a liquid cooling system output manifold 202 and run through the cold plates 201_1 through 201_N. Heat generated from the chips is transferred to their respective cold plates. The heat is then transferred to the coolant fluid that runs through the cold plates. The warmed fluid is then circled back to a liquid cooling system input manifold 203.

Between the input and output manifolds 202, 203 are multiple heat exchangers 204_1 through 204_M that can be dynamically enabled/disabled. Each heat exchanger 204, when enabled, removes heat from warmed fluid (e.g., at least in some implementations, as a radiator that exposes the warmed fluid to the ambient to transfer the fluid's heat to the ambient which, in turn, cools the fluid). Irrespective of how many heat exchangers are enabled, the output manifold 202 receives fluid that has been cooled by the enabled heat exchanger(s) and the process repeats.

As observed in FIG. 2, each heat exchanger includes a pair of valves 205, 206 (for ease of illustration, FIG. 2 only labels the valves for heat exchanger 204_1). In various implementations, a heat exchanger is enabled by opening its pair of valves and is disabled by closing its pair of valves (conceivably, some implementations may have only one valve per heat exchanger). When a heat exchanger is enabled, warmed fluid runs through the heat exchanger and the heat exchanger adds to the cooling capacity of the liquid cooling system. When a heat exchanger is disabled, fluid does not run through the heat exchanger and the heat exchanger does not add to the cooling capacity of the liquid cooling system.

A controller 207 monitors the heat being generated by the semiconductor chips, in some way, and enables an appropriate number of heat exchangers 204_1 through 204_N to sufficiently cool the semiconductor chips. Here, for example, a target junction temperature may be established for the semiconductor chips. The controller 207, in turn, enables the correct number of heat exchangers 204 to establish the desired junction temperature as a steady state.

Here, if the N semiconductor chips collectively dissipate more heat, more heat exchangers can be enabled to increase the cooling capacity of the system, whereas, if the N semiconductor chips collectively dissipate less heat, fewer heat exchangers can be enabled to decrease the cooling capacity of the system. By adaptively adjusting the cooling capacity of the cooling system, over-cooling inefficiency is reduced (if not avoided).

It is noteworthy that prior art approaches have heretofore integrated only large, expensive, permanently enabled high capacity heat exchanger(s) in systems having high performance semiconductor chips. In general, such large capacity exchangers consume large amounts of real estate within the system making overall cooling system integration more challenging. Moreover, such large capacity heat exchangers have a tendency to over-cool the high performance semiconductor chips when the chips are being modestly utilized.

By contrast, in various embodiments of the improved system of FIG. 2, the M heat exchangers are implemented as low capacity heat exchangers and/or lower cost heat exchangers. For example, heat exchangers designed to dissipate only 50 Watts (W) or less. Different combinations of heat exchanger capacity across the heat exchangers is also possible (e.g., some heat exchanger(s) are designed to dissipate more energy/heat than other exchangers). As such, there can exist embodiment where at least one heat exchanger dissipates more than 50 W.

Although any one of the low capacity heat exchangers could have difficulty cooling any one of the chips, or all of the chips, by itself, the cooling capacity of the overall system can easily meet the cooling needs of all of the chips (even when they are dissipating maximum amounts of heat) by enabling a sufficient number of the low capacity exchangers.

Here, in terms of heat exchanger enablement/disablement, the cooling system of FIG. 2 has M different cooling capacity states (one state for each of the M heat exchangers). Thus, if each of the M heat exchangers remove an approximately same amount of heat per unit volume of fluid per unit of time ("X"), the cooling system of FIG. 2 has different cooling capacity settings of X, 2X, 3X, . . . MX. Moreover, in various embodiments, the controller 207 is also able to adjust the flow rate of the coolant through the system. Assuming, e.g., there are Y different flow rates that the fluid can be pumped according to, there are MY different cooling capacity settings that the cooling system can be configured to implement.

Further still, in yet other or combined embodiments, the system is able to adjust the flow of air through any/all enabled heat exchangers (e.g., by modulating a number of fans and/or the speed of such fan(s)) thereby adjusting their cooling capacity. As such, if there are Z different air flow settings, the system could support MYZ different cooling capacity settings.

Such granularity and range allows the cooling system to dynamically adjust its cooling capacity to a precise setting that removes enough heat from the semiconductor chips to keep them, e.g., at some desired internal temperature, while, at the same time, not over-cooling the semiconductor chips.

FIG. 3 shows a basic methodology that embodiments of the cooling system's controller 207 is designed to implement. As observed in FIG. 3, a target temperature is asserted for the system's semiconductor chips 301 for a particular power consumption of the system's semiconductor chips. In various embodiment, the target temperature is specified by a user (e.g., an IS manager or IS management software that seeks to control the temperature of system's respective chips). Here, the target temperature can be an (equally or otherwise) weighted temperature of each of the semiconductor chips that are cooled by the system.

The target temperature, in various embodiments, is a die temperature of the chips (also referred to as a junction temperature) that is no higher than a maximum rated die temperature that is specified for the chips. Here, different target temperatures correspond to different die temperatures beneath the maximum rated die temperature and correspondingly different degrees of cooling system aggressiveness.

Notably, for a constant cooling system capacity, the die temperatures of the chips will rise as their power consumption rises, and, likewise, the die temperatures of the chips will fall as their power consumption falls. As such, the controller 207, in order to determine the appropriate cooling capacity needed to reach a particular target die temperature, in various embodiments, is also informed of the chips' power consumption ($P_{chip}$).

The chips' power consumption can be articulated explicitly (e.g., in Watts (W)), or, implicitly. In the case of implicitly provided power consumption, as one example, $P_{chip}$ is defined as a workload. Here, different use cases of the system will correspond to different chip power consumptions. For example, if the system is an array of processors, the array of processors will consume more power if they are to concurrently execute long sequences of intensive numeric calculations than if they are to concurrently execute low end control code that is frequently idling. The numerically intensive calculations can be assigned a first workload ID that corresponds to a higher $P_{chip}$, whereas, the low end control code can be assigned a second workload ID that corresponds to lower $P_{chip}$.

In yet other embodiments, implicit power consumption is provided as the amount of heat that the chips introduce to the coolant fluid. For instance, the difference in coolant temperature as between the manifold input 203 and the manifold output 202 ($T_{in}$–$T_{out}$), and/or, as between the manifold input 203 and the ambient temperature ($T_{amb}$), is used as a measurement of chip power consumption. If such a difference increases, chip power consumption is increasing. By contrast, if such a difference decreases, chip power consumption is decreasing.

Once the target temperature is established 301 for the applicable chip power consumption, the controller determines 302 the appropriate number of enabled heat exchangers to best meet the target temperature as a steady state. Once the appropriate number of enabled heat exchangers is determined 302, the controller adjusts the heat exchanger valves to actually enable the appropriate number of heat exchangers 303.

In various embodiments, e.g. in order to confirm or monitor that the actual die temperatures are within an acceptable range of the target temperature, the chips' die temperatures are explicitly measured (the chips provide internal temperature readings) and provide to the controller 207. In yet other embodiments, the controller 207 receives other temperature readings that can be correlated back to die temperature (e.g., chip package temperature, coolant fluid temperature between the cold plates 201 and input manifold 203, etc.) and uses these readings to determine that desired target temperatures are within range.

FIG. 4 shows an embodiment of the manner in which the appropriate number of heat exchangers can be determined 302 for any particular combination of target temperature and power consumption.

As observed in FIG. 4, in an embodiment, the controller refers to one or more look-up tables (LUTs) 401 that contain pre-defined entries that identify an appropriate number of enabled heat exchangers for various combinations of target temperature and chip power consumption. If the input temperature and power consumption parameters match a LUT entry, the number of heat exchangers provided by that entry is identified 402 as the appropriate number of heat exchangers to enable for the input combination of target temperature and power consumption. Alternatively, if no exact match exists but multiple LUT entries exist from which an appropriate number of heat exchangers can be extrapolated, the extrapolation is performed 402 to determine the appropriate number of heat exchangers to enable.

If the input target temperature and power consumption combination does not match on a LUT entry and an extrapolation cannot be performed, the controller dynamically determines the appropriate number of enabled heat exchangers 403 by selectively enabling different numbers of heat exchangers, observing the resulting steady state, and choosing the number of heat exchangers that results in a steady state chip temperature that best meets the target temperature. Once the appropriate number of heat exchangers is determined 403, the LUT information is updated to include the number of heat exchangers for the particular combination of target temperature and power consumption that "missed" during the earlier LUT lookup 402. The power consumption component can be articulated as an actual temperature and/or a workload.

Here, in various embodiments, it is preferable to obtain the appropriate number of heat exchangers from the LUT information 402 than from the dynamically determined process 403 because LUT look-ups (or extrapolations) can be performed very quickly, whereas, the dynamically determined process 403 can be akin to a trial and error process that consumes time. As such, in various embodiments, design engineers should attempt to cover as many combinations of target temperature and power consumption in the LUT information as is practicable (e.g., based on theoretical and/or empirical analysis) so that dynamic determinations during actual usage runtime are minimized.

Regardless, over an extended run time of the system, there are apt to be changes in target temperature (e.g., target temperatures are allowed to run higher during lower workloads to save cooling expenses, target temperatures are driven lower during higher workloads to ensure chip maximum rated junction temperature is not exceed, etc.). Likewise, power consumption conditions can change in view of workload changes applied to the system. In response, e.g., in the case where target temperature is kept constant throughout such power consumption changes, the cooling capacity of the system is changed including changing the number of enabled heat exchangers.

Here, each change in target temperature (e.g., as provided from a user) or chip power consumption (e.g., as observed by a change in any of detected chip supply voltage and/or current draw, detected chip temperature, detected chip package temperature, detected coolant temperature, system workload, etc.) causes another run through of the processes of FIGS. 3 and 4 to see if the change warrants a change in the number of currently enabled heat exchangers. Here, to impose some hysteresis in the system, changes in any of the aforementioned variables that are sufficient to cause re-execution of the processes of FIGS. 3 and 4 for possible determination of a new number of enabled heat exchangers should exhibit some respectable departure from their earlier state (e.g., the steady state as of the immediately preceding execution of the processed of FIGS. 3 and 4).

In various embodiments, the LUT information and/or dynamic determination process deliberately chooses the fewest number of enabled heat exchangers to meet the target temperature for the applicable power consumption.

In various embodiments, as alluded to above, the controller supports a "pre-emptive" mode in which a change in power consumption triggers a new run through of the processes of FIGS. 3 and 4 even though the change in power consumption has not actually occurred yet. Here, the controller can be informed that the system is about to receive a (e.g., dramatic) change in workload and be provided with a workload ID that corresponds to the anticipated workload and/or an expected power consumption that will result. In response, the controller can change the number of heat exchangers (if warranted) as advance preparation for the new workload (as such, if target temperature is kept constant, the die temperature will not rise as a consequence of the new workload).

FIGS. 5a and 5b depict different approaches for performing dynamic determination 403 of the number of heat exchangers. FIG. 5a shows an approach when an increase in cooling capacity is anticipated (e.g., because the target temperature has lessened or the power consumption has increased). By contrast, FIG. 5b shows an approach when a decrease in cooling capacity is anticipated (e.g., because the target temperature has increased or the power consumption has increased).

Here, both the processes of FIGS. 5a and 5b attempt to gauge 501, 511 whether the change in cooling capacity (whether an increase or decrease) is dramatic or subtle. If the change is dramatic, a number of heat exchangers are initially affected 502, 512. Here, dramatic change can be detected in real time by a dramatic change in target temperature, and/or, a dramatic change in power consumption. Large changes in power consumption can be determined from, e.g., an observed large change in actual measured chip power consumption, an observed large change in the difference between the temperature of the coolant fluid at the input manifold ($T_{in}$) and either of the coolant temperature at the output manifold ($T_{out}$) or the ambient temperature ($T_{amb}$), a pre-emptive warning of an anticipated change in system workload, etc.

As such, if a large increase in cooling capacity is warranted, all heat exchangers are enabled 502 (FIG. 5a). The resulting steady state is observed, and, if over-cooling appears to be present (chip temperature is well below target temperature), a first heat exchanger is disabled. Again, the resulting steady state is observed, and, if over-cooling still appears to be present (chip temperature remains well below target temperature), another heat exchanger is disabled. The process continues until the number of enabled heat exchangers keeps the chip temperature below the target temperature and disabling another heat exchanger will cause chip temperature to rise above the target temperature.

If a large decrease in cooling capacity is warranted, a number of heat exchangers are disabled 512 (FIG. 5b)(the remaining number of enabled heat exchangers should keep the chip temperature below its maximum rated temperature). The resulting steady state is observed, and, if under-cooling appears to be present (chip temperature is above target temperature), a first heat exchanger is enabled. Again, the resulting steady state is observed, and, if under-cooling still appears to be present (chip temperature remains above target temperature), another heat exchanger is disabled. The process continues until the number of enabled heat exchangers keeps the chip temperature below the target temperature and enabling another heat exchanger will cause under-cooling of the chip.

By contrast, if the change is not dramatic (modest), heat exchangers can be enabled one at time 503 from their present state if a cooling capacity increase is anticipated (FIG. 5a), or, heat exchangers can be disabled one at time 513 from their present state if a cooling capacity decrease is anticipated (FIG. 5b). In the case of the former (FIG. 5a), heat exchangers are enabled incrementally until the number of enabled heat exchangers keeps the chip temperature below the target temperature and disabling another heat exchanger will cause over-cooling. In the case of the later (FIG. 5b), heat exchangers are disabled incrementally until the number of enabled heat exchangers keeps the chip temperature below the target temperature and disabling another heat exchanger will cause the chip to rise above the target temperature. Modest change can also be detected by the same mechanisms described above except that the changes are not dramatic.

Whether a change is dramatic or modest can be based on whether the new target temperature or power consumption reaches some threshold. For example, if the new target temperature falls below some percentage of its current value, and/or, if the new power consumption rises above some percentage of its current value, a threshold is crossed that triggers dramatic change as opposed to modest change.

In various embodiments, the enablement/disablement of heat exchangers corresponds to a "coarse" cooling capacity adjustment, while, either or both of fan speed and fluid flow adjustments correspond to a "fine" cooling capacity adjustment. Thus, for example, once a number of enabled heat exchangers is determined, the controller can further adjust fan speed and/or fluid flow rate to "zero-in" on the target temperature. Said another way, if the number of heat exchangers was decremented by one, fan and/or fluid adjustment might not be able to prevent the target temperature being exceeded, and/or, if the number of heat exchangers was incremented by one, fan and/or fluid adjustment might not be able to prevent over-cooling.

As mentioned above, in various embodiments, the LUT information and/or dynamic determination process deliberately chooses the fewest number of enabled heat exchangers to meet the target temperature for the applicable power consumption. Alternatively or in combination, cooling system efficiency can be used to determine the appropriate number heat exchangers to enable.

Cooling system efficiency is 100% when the temperature of the cooled fluid ($T_{out}$) that is emanated from the output manifold 202 is equal to the ambient temperature ($T_{amb}$) (because ambient air is run through the heat exchangers, generally, the liquid cannot be cooled beneath ambient). Thus, some configurations may specify the target temperature is to be reached with the number of enabled heat exchangers that also achieve 100% efficiency. Other configurations may specify that the target temperature is to be reached with the number of enabled heat exchangers that also achieve something less than 100% efficiency (80%, 75%, etc.). Here, less than 100% efficiency can translate into fewer heat exchangers being enabled as compared to a 100% efficiency solution.

Note that with a single system cooling multiple chips, the amount of heat that is added to and then removed from the fluid will be a function of the usage of all of the chips combined. In some cases, one of the chips may be heavily used resulting in over-cooling of a lesser used one of the chips. However, if such over-cooling exists, it is confined to the chips within the system rather than in an entire system as with the prior art approach. In more elaborate embodiments, each chip is cooled with its own dedicated system as described above so that chip under-cooling is avoided for each chip in the system.

Although the embodiments described above have focused on an embodiment in which the cooling system is integrated within a system so as to confine chip over-cooling exposure within the system, other embodiments may choose to allow over-cooling for a group of systems that is less than all the systems in a rack. For instance, the cooling system as described above may be used to cool the chips of two or three systems. Here, over-cooling of chips within such systems might occur, or even of the systems themselves (e.g., if one of the systems is being heavily utilized but the others are not). But such over-cooling is still confined to less systems than would otherwise result if cooling capacity were modulated at the rack or multiple rack level. The system of FIG. 2 can be extended to multiple systems by integrating the controller and heat exchangers, e.g., in the rack outside the systems. Each of the systems has fluid input and output ports to connect to the manifold outputs and inputs of the cooling system, respectively.

FIG. 6 shows another embodiment in which the liquid cooling system includes valves 620 to shut off fluid flows to the cold plates 601 of semiconductor chips individually. Here, the controller 607 can be adapted to determine whether a particular chip's power consumption is sufficient enough to warrant liquid cooling. Here, for instance, each chip may have a hard-coded die temperature and/or power consumption beneath which no liquid cooling is required for the chip. If the controller 707 observes that the chip's temperature/power is beneath these specified levels, the controller 707 shuts off the valve to that chip.

The ability to shut off individually chips from liquid cooling provides for further cost and efficiency improvements. Here, for example, if one particular chip is under a heavy workload and is consuming large amounts of power, whereas all the other chips are hardly being utilized and do not need liquid cooling, the valves for the under utilized chips can be shut off leaving only the heavily utilized chip with its valve open. By so doing, the entire liquid cooling system is devoted only to the heavily utilized chip. As such, potentially fewer heat exchangers will need to be enabled than if all the chips were to be liquid cooled.

FIG. 7 shows a more detailed embodiment of the implementation for the controllers 207, 607 described above. The controller 707 can be composed of any combination of hardware and software to perform any of the above described controller operations. Hardware can be composed of dedicated hardwired logic circuitry (e.g., state machine logic circuit), programmable circuitry (e.g., a field programmable logic array (FPGA) logic circuit), or logic circuitry that can execute program code (e.g., controller, processor, etc.). Here, if the controller 707 is at least partially implemented with logic circuitry that can execute program code, the controller 707 will also be partially be implemented with program code that, when executed, helps perform controller operations.

The controller 707 is coupled to an information keeping device 710 that stores the aforementioned LUT information and any specified values for any of the one or more semiconductor chips that determine whether or not liquid cooling is to be applied to the one or more semiconductor chips. The information keeping device 710 can be composed of multiple actual/physical devices (memory chips, solid state drives (SSDs), etc.) and can be composed of both volatile memory (e.g., DRAM as a local memory for the controller) and non volatile memory (e.g., as a local memory for the controller and/or mass storage) to ensure that, e.g., the LUT information including any newly learned LUT information is preserved.

Various valve open/closed combinations can be applied as the correct state or response to a particular operational state of the semiconductor chips to be cooled. Some of these are shown in FIGS. 8a-8d (which shows different heat exchanger enablement scenarios) and FIGS. 9a-9d (which shows different cold plate valve shut-off scenarios). Although only four heat exchangers and four cold plates are shown, any combination of heat exchangers and sold plates can be used.

FIG. 10 depicts an example system. The system can use the teachings provided herein. System 1000 includes processor 1010, which provides processing, operation management, and execution of instructions for system 1000. Processor 1010 can include any type of microprocessor, central processing unit (CPU), graphics processing unit (GPU), processing core, or other processing hardware to provide processing for system 1000, or a combination of processors. Processor 1010 controls the overall operation of system 1000, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 1000 includes interface 1012 coupled to processor 1010, which can represent a higher speed interface or a high throughput interface for system components that needs higher bandwidth connections, such as memory subsystem 1020 or graphics interface components 1040, or accelerators 1042. Interface 1012 represents an interface circuit, which can be a standalone component or integrated onto a processor die. Where present, graphics interface 1040 interfaces to graphics components for providing a visual display to a user of system 1000. In one example, graphics interface 1040 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 1040 generates a display based on data stored in memory 1030 or based on operations executed by processor 1010 or both. In one example, graphics interface 1040 generates a display based on data stored in memory 1030 or based on operations executed by processor 1010 or both.

Accelerators 1042 can be a fixed function offload engine that can be accessed or used by a processor 1010. For example, an accelerator among accelerators 1042 can provide compression (DC) capability, cryptography services such as public key encryption (PKE), cipher, hash/authentication capabilities, decryption, or other capabilities or services. In some embodiments, in addition or alternatively, an accelerator among accelerators 1042 provides field select controller capabilities as described herein. In some cases, accelerators 1042 can be integrated into a CPU socket (e.g., a connector to a motherboard or circuit board that includes a CPU and provides an electrical interface with the CPU). For example, accelerators 1042 can include a single or multi-core processor, graphics processing unit, logical execution unit single or multi-level cache, functional units usable to independently execute programs or threads, application specific integrated circuits (ASICs), neural network processors (NNPs), "X" processing units (XPUs), programmable control logic, and programmable processing elements such as field programmable gate arrays (FPGAs). Accelerators 1042 can provide multiple neural networks, processor cores, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 1020 represents the main memory of system 1000 and provides storage for code to be executed by processor 1010, or data values to be used in executing a routine. Memory subsystem 1020 can include one or more memory devices 1030 such as read-only memory (ROM), flash memory, volatile memory, or a combination of such devices. Memory 1030 stores and hosts, among other things, operating system (OS) 1032 to provide a software platform for execution of instructions in system 1000. Additionally, applications 1034 can execute on the software platform of OS 1032 from memory 1030. Applications 1034 represent programs that have their own operational logic to perform execution of one or more functions. Processes 1036 represent agents or routines that provide auxiliary functions to OS 1032 or one or more applications 1034 or a combination. OS 1032, applications 1034, and processes 1036 provide software logic to provide functions for system 1000. In one example, memory subsystem 1020 includes memory controller 1022, which is a memory controller to generate and issue commands to memory 1030. It will be understood that memory controller 1022 could be a physical part of processor 1010 or a physical part of interface 1012. For example, memory controller 1022 can be an integrated memory controller, integrated onto a circuit with processor 1010. In some examples, a system on chip (SOC or SoC) combines into one SoC package one or more of: processors, graphics, memory, memory controller, and Input/Output (I/O) control logic.

A volatile memory is memory whose state (and therefore the data stored in it) is indeterminate if power is interrupted to the device. Dynamic volatile memory requires refreshing the data stored in the device to maintain state. One example of dynamic volatile memory incudes DRAM (Dynamic Random Access Memory), or some variant such as Synchronous DRAM (SDRAM). A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/Output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications. The JEDEC standards are available at www.jedec.org.

While not specifically illustrated, it will be understood that system 1000 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect express (PCIe) bus, a HyperTransport or industry standard architecture (ISA) bus, a small computer system interface (SCSI) bus, Remote Direct Memory Access (RDMA), Internet Small Computer Systems Interface (iSCSI), NVM express (NVMe), Coherent Accelerator Interface (CXL), Coherent Accelerator Processor Interface (CAPI), a universal serial bus (USB), or an Institute of Electrical and Electronics Engineers (IEEE) standard 1394 bus.

In one example, system 1000 includes interface 1014, which can be coupled to interface 1012. In one example, interface 1014 represents an interface circuit, which can include standalone components and integrated circuitry. In one example, multiple user interface components or peripheral components, or both, couple to interface 1014. Network interface 1050 provides system 1000 the ability to communicate with remote devices (e.g., servers or other computing devices) over one or more networks. Network interface 1050 can include an Ethernet adapter, wireless interconnection components, cellular network interconnection components, USB (universal serial bus), or other wired or wireless standards-based or proprietary interfaces. Network interface 1050 can transmit data to a remote device, which can include sending data stored in memory. Network interface 1050 can receive data from a remote device, which can include storing received data into memory. Various embodiments can be used in connection with network interface 1050, processor 1010, and memory subsystem 1020.

In one example, system 1000 includes one or more input/output (I/O) interface(s) 1060. I/O interface 1060 can include one or more interface components through which a user interacts with system 1000 (e.g., audio, alphanumeric, tactile/touch, or other interfacing). Peripheral interface 1070 can include any hardware interface not specifically mentioned above. Peripherals refer generally to devices that connect dependently to system 1000. A dependent connection is one where system 1000 provides the software platform or hardware platform or both on which operation executes, and with which a user interacts.

In one example, system 1000 includes storage subsystem 1080 to store data in a nonvolatile manner. In one example, in certain system implementations, at least certain components of storage 1080 can overlap with components of memory subsystem 1020. Storage subsystem 1080 includes storage device(s) 1084, which can be or include any conventional medium for storing large amounts of data in a nonvolatile manner, such as one or more magnetic, solid state, or optical based disks, or a combination. Storage 1084 holds code or instructions and data 1086 in a persistent state (e.g., the value is retained despite interruption of power to system 1000). Storage 1084 can be generically considered to be a "memory," although memory 1030 is typically the executing or operating memory to provide instructions to processor 1010. Whereas storage 1084 is nonvolatile, memory 1030 can include volatile memory (e.g., the value or state of the data is indeterminate if power is interrupted to system 1000). In one example, storage subsystem 1080 includes controller 1082 to interface with storage 1084. In one example controller 1082 is a physical part of interface 1014 or processor 1010 or can include circuits or logic in both processor 1010 and interface 1014.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 1000. More specifically, power source typically interfaces to one or multiple power supplies in system 1100 to provide power to the components of system 1000. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 1000 can be implemented as a disaggregated computing system. For example, the system 1100 can be implemented with interconnected compute sleds of processors, memories, storages, network interfaces, and other components. High speed interconnects can be used such as PCIe, Ethernet, or optical interconnects (or a combination thereof). For example, the sleds can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

FIG. 11 depicts an example of a data center. Various embodiments can be used in or with the data center of FIG. 11. As shown in FIG. 11, data center 1100 may include an optical fabric 1112. Optical fabric 1112 may generally include a combination of optical signaling media (such as optical cabling) and optical switching infrastructure via which any particular sled in data center 1100 can send signals to (and receive signals from) the other sleds in data center 1100. However, optical, wireless, and/or electrical signals can be transmitted using fabric 1112. The signaling connectivity that optical fabric 1112 provides to any given sled may include connectivity both to other sleds in a same rack and sleds in other racks. Data center 1100 includes four racks 1102A to 1102D and racks 1102A to 1102D house respective pairs of sleds 1104A-1 and 1104A-2, 1104B-1 and 1104B-2, 1104C-1 and 1104C-2, and 1104D-1 and 1104D-2. Thus, in this example, data center 1100 includes a total of eight sleds. Optical fabric 1112 can provide sled signaling connectivity with one or more of the seven other sleds. For example, via optical fabric 1112, sled 1104A-1 in rack 1102A may possess signaling connectivity with sled 1104A-2 in rack 1102A, as well as the six other sleds 1104B-1, 1104B-2, 1104C-1, 1104C-2, 1104D-1, and 1104D-2 that are distributed among the other racks 1102B, 1102C, and 1102D of data center 1100. The embodiments are not limited to this example. For example, fabric 1112 can provide optical and/or electrical signaling.

FIG. 11 depicts an environment 1100 includes multiple computing racks 1102, each including a Top of Rack (ToR) switch 1104, a pod manager 1106, and a plurality of pooled system drawers. Generally, the pooled system drawers may include pooled compute drawers and pooled storage drawers to, e.g., effect a disaggregated computing system. Optionally, the pooled system drawers may also include pooled memory drawers and pooled Input/Output (I/O) drawers. In the illustrated embodiment the pooled system drawers include an INTEL® XEON® pooled computer drawer 1108, and INTEL® ATOM™ pooled compute drawer 210, a pooled storage drawer 212, a pooled memory drawer 214, and an pooled I/O drawer 1116. Each of the pooled system drawers is connected to ToR switch 1104 via a high-speed link 1118, such as a 40 Gigabit/second (Gb/s) or 100 Gb/s Ethernet link or an 100+ Gb/s Silicon Photonics (SiPh) optical link. In one embodiment high-speed link 1118 comprises an 800 Gb/s SiPh optical link.

Again, the drawers can be designed according to any specifications promulgated by the Open Compute Project (OCP) or other disaggregated computing effort, which strives to modularize main architectural computer components into rack-pluggable components (e.g., a rack pluggable processing component, a rack pluggable memory component, a rack pluggable storage component, a rack pluggable accelerator component, etc.).

Multiple of the computing racks 1100 may be interconnected via their ToR switches 1104 (e.g., to a pod-level switch or data center switch), as illustrated by connections to a network 1120. In some embodiments, groups of computing racks 1102 are managed as separate pods via pod manager(s) 1106. In one embodiment, a single pod manager is used to manage all of the racks in the pod. Alternatively, distributed pod managers may be used for pod management operations.

RSD environment 1100 further includes a management interface 1122 that is used to manage various aspects of the RSD environment. This includes managing rack configuration, with corresponding parameters stored as rack configuration data 1124.

Embodiments herein may be implemented in various types of computing, smart phones, tablets, personal computers, and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. It is noted that hardware, firmware and/or software elements may be collectively or individually referred to herein as "module," "logic," "circuit," or "circuitry."

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

The invention claimed is:

1. An apparatus, comprising:
heat exchangers and first valves, the first valves to at least one of enable or disable respective ones of the heat exchangers;
memory to store information that correlates a number of the heat exchangers to cool one or more semiconductor chips to a target temperature for a power consumption of the one or more semiconductor chips, the stored information including correlations of the number of the heat exchangers for a plurality of combinations of different target temperatures and power consumption values; and
at least one processor circuit to dynamically determine, during runtime of a system having the one or more semiconductor chips, a number of the heat exchangers to enable liquid cooling of the one or more semiconductor chips based on a particular target temperature for the one or more semiconductor chips for a particular power consumption of the one or more semiconductor chips, the at least one processor circuit to update the stored information in the memory with the dynamically determined number of the heat exchangers for the particular target temperature and the particular power consumption.

2. The apparatus of claim 1, wherein the at least one processor circuit is to dynamically determine the number of heat exchangers to enable in response to the particular target temperature and the particular power consumption absent from the stored information.

3. The apparatus of claim 1, wherein at least one of the heat exchangers is designed to dissipate no more than 50 W.

4. The apparatus of claim 1, wherein the dynamic determination of the number of the heat exchangers to enable is performed by at least one of selectively enabling or disabling different combinations of the heat exchangers via control of the first valves associated with respective ones of the heat exchangers.

5. The apparatus of claim 4, wherein prior to the selectively enabling or disabling the different combinations of the heat exchangers, the at least one processor circuit is to initially enable all of the heat exchangers and then disable a next one of the heat exchangers until the determined number of enabled heat exchangers is reached.

6. The apparatus of claim 5, wherein one or more of the at least one processor circuit is to initially enable all the heat exchangers is in response to an increase in the power consumption of the one or more semiconductor chips that exceeds a threshold.

7. The apparatus of claim 4, wherein one or more of the at least one processor circuit is to selectively enable or disable by repeatedly enabling a next disabled one of the heat exchangers until the determined number of enabled heat exchangers is reached.

8. The apparatus of claim 4, wherein one or more of the at least one processor circuit is to selectively enable or disable by repeatedly disabling a next enabled one of the heat exchangers until the determined number of enabled heat exchangers is reached.

9. The apparatus of claim 1, further including a plurality of second valves, respective ones of the second valves associated with respective ones of the semiconductor chips, the at least one processor circuit to control operation of the second valves to enable liquid cooling to the respective ones of the semiconductor chips associated with the respective ones of the second valves.

10. An apparatus, comprising:
a liquid cooling system that includes a plurality of heat exchangers and a plurality of first valves;
interface circuitry;
machine-readable instructions; and
at least one processor circuit to be programmed by the machine-readable instructions to:
cause the first valves to at least one of enable or disable operation of the heat exchangers within the liquid cooling system;
dynamically determine, during runtime of a system having one or more semiconductor chips, a threshold number of the heat exchangers to enable based on a particular target temperature for the one or more semiconductor chips for a particular power consumption of the one or more semiconductor chips;
update stored information in memory with a dynamically determined correlation of the threshold number of heat exchangers based on the particular target temperature and the particular power consumption of the one or more semiconductor chips.

11. The apparatus of claim 10, wherein the at least one processor circuit is to dynamically determine the threshold number of heat exchangers to enable in response to the particular target temperature and the particular power consumption not being represented in the stored information.

12. The apparatus of claim 10, wherein at least one of the heat exchangers is structured to dissipate no more than 50 W.

13. The apparatus of claim 10, wherein the at least one processor circuit is to perform the dynamic determination of the threshold number of heat exchangers to enable by at least one of selectively enabling or disabling different combinations of the heat exchangers until the threshold number is reached.

14. The apparatus of claim 13, wherein the at least one processor circuit is to selectively enable or disable by initially enabling all of the heat exchangers and then disabling a next one of the heat exchangers until the determined threshold number of enabled heat exchangers is reached.

15. The apparatus of claim 14, wherein the at least one processor circuit is to initially enable all of the heat exchangers is in response to an increase in a power consumption of the one or more semiconductor chips that exceeds a threshold.

16. The apparatus of claim 13, wherein the at least one processor circuit is to selectively enable or disable by repeatedly enabling a next disabled one of the heat exchangers until the determined threshold number of enabled heat exchangers is reached.

17. The apparatus of claim 13, wherein the at least one processor circuit is to selectively disable a next enabled one of the heat exchangers until the determined threshold number of enabled heat exchangers is reached.

18. The apparatus of claim 10, wherein the liquid cooling system further includes second valves for individual ones of the one or more semiconductor chips, the at least one processor circuit is to adaptively control the second valves to cause liquid cooling to the individual ones of the one or more semiconductor chips.

19. An apparatus, comprising:
one or more semiconductor chips;
a first manifold upstream from the one or more semiconductor chips;
a second manifold downstream from the one or more semiconductor chips;
heat exchangers to cool fluid between the first manifold and the second manifold;
first valves to at least one of enable or disable respective ones of the heat exchangers; and
interface circuitry;
machine-readable instructions; and
at least one processor circuit to be programmed by the machine-readable instructions to:
determine a target temperature of the one or more semiconductor chips associated with a power consumption of the one or more semiconductor chips;
identify, from a data source, a number of heat exchangers to regulate the one or more semiconductors to the target temperature;
in response to determining that the number of heat exchangers cannot be identified from the data source, dynamically determine the number of the heat exchangers to regulate the one or more semiconductors to the target temperature;
operate the first valves to at least one of enable or disable respective ones of the heat exchangers corresponding to the dynamically determined number of the heat exchangers; and
update the data source to include a correlation between the dynamically determined number of the heat exchangers and the target temperature associated with the power consumption.

20. The apparatus of claim 19, further including second valves associated with respective ones of the one or more semiconductor chips, the second valves to control fluid flow to respective ones of the one or more semiconductor chips.

21. The apparatus of claim 20, wherein the at least one processor circuit is to cause respective ones of the second valves to enable fluid flow to the respective ones of the semiconductor chips when the respective ones of the semiconductor chips associated with the respective ones of the second valves has an operating temperature associated with an operating power consumption that exceeds the target temperature, and cause respective ones of the second valves to at least one of prevent or restrict fluid flow to the respective ones of the semiconductor chips when the respective ones of the semiconductor chips associated with the respective ones of the second valves has an operating temperature associated with an operating power consumption that does not exceed the target temperature.

\* \* \* \* \*